United States Patent [19]
Michiyama

[11] Patent Number: 5,410,511
[45] Date of Patent: Apr. 25, 1995

[54] METHODS OF CONTROLLING THE ERASING AND WRITING OF INFORMATION IN FLASH MEMORY

[75] Inventor: Junji Michiyama, Fukuoka, Japan

[73] Assignee: Matsushita Electronics Corporation, Osaka, Japan

[21] Appl. No.: 200,497

[22] Filed: Feb. 23, 1994

[30] Foreign Application Priority Data

Feb. 24, 1993 [JP] Japan .................................. 5-035009

[51] Int. Cl.$^6$ ........................ G11C 7/00; G11C 11/40
[52] U.S. Cl. .................................. 365/218; 365/185; 365/900
[58] Field of Search ............ 365/218, 185, 900, 189.01

[56] References Cited

U.S. PATENT DOCUMENTS

| | | | |
|---|---|---|---|
| 4,742,491 | 5/1988 | Liang | 365/218 |
| 4,841,482 | 6/1989 | Kreifels et al. | 365/185 |
| 4,931,996 | 6/1990 | Yasuda | 365/208 |
| 4,975,883 | 12/1990 | Baker et al. | 365/226 |
| 5,042,009 | 8/1991 | Kazerounian | 365/185 |
| 5,122,985 | 6/1992 | Santin | 365/185 |
| 5,132,935 | 7/1992 | Ashmore | 365/185 |
| 5,295,107 | 3/1994 | Okazawa | 365/218 |

OTHER PUBLICATIONS

Virgil N. Kynett et al., "An In-System Reprogrammable 32KX8 CMOS Flash Memory", IEEE Journal of Solid–State Circuits, vol. 23, No. 5, Oct. 1988, pp. 1157–1163.

S. Yamada et al., "A Self–Convergence Erasing Scheme For A Simple Stacked Gate Flash EEPROM", IEDM Tech. Digest, 1991, p. 307–310.

Primary Examiner—Joseph A. Popek
Assistant Examiner—Son Mai
Attorney, Agent, or Firm—Willian Brinks Hofer Gilson & Lione

[57] ABSTRACT

In a flash memory, the value of an erasing voltage pulse is temporarily set so that information stored in all the memory cells is erased by means of the erasing voltage pulse. The value of the erasing voltage pulse is reset so that the highest threshold voltage of all the reduced voltages of the memory cells after erasing reaches a specified value or under and that the leakage current generated in memory cells on the same bit line reaches a specified limit value or under. With the application of the reset erasing voltage pulse to all the memory cells, the content of the flash memory is erased, thereby preventing the misreading of the information stored in the memory due to the leakage current generated in the memory cells.

4 Claims, 4 Drawing Sheets

METHODS OF CONTROLLING THE ERASING AND WRITING OF INFORMATION IN FLASH MEMORY

BACKGROUND OF THE INVENTION

The present invention relates to a method of controlling a voltage pulse which is applied in erasing or writing information in a flash memory.

In general, the writing state or erasing state of a flash memory is determined by the level of the threshold voltage of its memory cell. There are two cases in which the level of the threshold voltage is used differently for determining the state of the flash memory. In one case, the state at a high threshold voltage is used as the writing state, while the state at a low threshold voltage is used as the erasing state. In the other case, the state at a low threshold voltage is used as the writing state, while the state at a high threshold voltage is used as the erasing state, contrary to the former case.

FIG. 3 shows the distribution of the threshold voltages of a plurality of memory cells which were written or erased under the same conditions when the state at a high threshold voltage is used as the writing state and the state at a low threshold voltage is used as the erasing state. In FIG. 3, the horizontal axis designates variations in threshold voltage of the memory cells, while the vertical axis designates the number of the memory cells. The level of the threshold voltage of each memory cell can be changed by applying a voltage pulse to the memory cell, and by changing the direction, magnitude, and application time of the voltage pulse, the level of the threshold voltage can be controlled. However, since the characteristics of memory cells constituting the flash memory are different, even when the voltage pulses similarly set are used to erase or write information in the plurality of memory cells at a time, the threshold voltages of the individual memory cells vary accordingly, resulting in the distribution in FIG. 3.

FIG. 4 shows the basic flow of a conventional erase control method when a flash memory having memory cells which are different in characteristics is subjected to a simultaneous erasing operation. As shown in the drawing, the conventional erase control method consists of Steps S11 to S15, which are described below.

Step S11: Each memory cell is programmed prior to erasing. That is, each memory cell is set in the state at a high threshold voltage.

Step S12: Next, the voltage pulse to be applied for erasing data is temporarily set to a specified value.

Step 13: With the application of the voltage pulse, the erasing of data is performed with respect to each memory cell.

Step 14: Verification is carried out so as to check that the threshold voltage of each memory cell that has undergone the erasing operation is sufficiently lowered, i.e., that the erasing operation was performed completely. Specifically, it is examined whether or not the threshold voltage of each memory cell has reached a specified value or under.

If there is at least one memory cell having a high threshold voltage, the procedure returns from Step S15 to S12, where the erasing voltage pulse is reset, so as to perform a re-erasing operation in Step 13 and then execute verification again in Step S14. After repeating the steps of erasing, verification, and the like, if the threshold voltage of memory cells A (see FIG. 3) that are slowest at erasing (i.e., the maximum value of the threshold voltages of the memory cells) has reached the specified value or under, the result of the verification becomes "Yes", thereby completing the erase control.

The setting of the voltage in the verification is controlled by means of a constant voltage circuit disposed in a flash memory or by means of an external apparatus for setting and supplying the voltage to the flash memory. Thus, according to the conventional method, the erase control is performed on the basis of the memory cells having the highest threshold voltage, in view of the variations in threshold voltage of the memory cells. On the other hand, an influence on excessively erased memory cells B, which are fast at erasing as shown in FIG. 3, is not directly detected in the verification. The voltage for verification is set in consideration of the distribution of the threshold voltages of the memory cells B fast at erasing, which was deduced from the threshold voltages of the memory cells A slow at erasing, so as to secure the voltage for reading information from the flash memory.

Since the power-supply voltage of a conventional flash memory is considerably high, the threshold voltages of the memory cells are accordingly high. Therefore, the threshold voltage never reaches an excessively low value after the erasing of the memory, even though the difference in characteristic of the memory cells constituting the flash memory is considered. Consequently, even when the memory cells A slow at erasing are solely checked in the verification without directly checking the memory cells B fast at erasing, the erasing voltage pulse can be set by deducing the distribution of the threshold voltages of the memory cells B, with the result that the memory cells B are never put in the excessively erased state after they were erased. In other words, no consideration is paid to those memory cells having lower threshold voltages.

However, as the power-supply voltage has become lower in recent years, it becomes necessary to lower the threshold voltage. If the conventional erase control method is used to perform a low-voltage operation, however, there arises a possibility that an excessively erased memory cell having a threshold voltage of 0 V or less may be produced, for such an excessively erased memory cell is not detected in the conventional method.

In the excessively erased memory cell having a threshold voltage of 0 V or less, a leakage current is generated. That is, even when the gate voltage is 0 V, a current is allowed to flow between the source and drain. In the case of reading information from a specific memory cell, therefore, if an excessively erased memory cell exists on the same bit line, the information stored in the specific memory cell to be read may be misread under the influence of the leakage current. For example, even when the specific memory cell to be read is in the state at a high threshold voltage, i.e., in High state which does not allow the flow of an electric current, if an excessively erased memory cell exists on the same bit line and the leakage current flows along the bit line, the wrong information that the specific memory cell is in Low state is obtained.

Where is another conventional method in which the state of the memory cell at a high threshold voltage is used for erasing, while the state at a low threshold voltage is used for writing, contrary to the distribution in FIG. 3. In this case also, if the threshold voltage of memory cells that are fastest at writing, i.e., excessively written memory cells reaches 0 V or under, the misreading of information may occur under the influence of the leakage current, similarly to the case shown in FIG. 3.

SUMMARY OF THE INVENTION

The present invention has been achieved in view of the recent tendency toward lower power-supply voltage. Accordingly, it is an object of the present invention to enable the proper reading of information, after a flash memory was subjected to an erasing or writing operation, without allowing a leakage current to be generated from a transistor constituting a memory cell.

According to the method of controlling the erasing of information in a flash memory of the present invention, the value of an erasing voltage pulse is temporarily set so that the information stored in all the memory cells are erased by means of the erasing voltage pulse. Then, the value of the erasing voltage pulse is reset so that the highest voltage of all the reduced threshold voltages of the memory cells reaches a specified value or under and that the leakage current generated in a memory cell on the same bit line reaches a specified limit value or under. The reset erasing voltage pulse is applied to all the memory cells, thereby erasing the content of the flash memory.

According to the method of controlling the writing of information in a flash memory, the value of a writing voltage pulse is temporarily set so that information is stored in a specific memory cell by means of the writing voltage pulse. Then, the value of the writing voltage pulse is reset so that the threshold voltage of the specific memory cell in which the information is stored reaches a specified value or under and that the leakage current generated in the specific memory cell reaches a specified limit value or under. The reset writing voltage pulse is applied to the specific memory cell, thereby writing information in the flash memory.

In the above methods of controlling the erasing and writing of information of the present invention, the leakage current generated under the influence of memory cells which are fast at erasing and the like is directly detected, which is contrary to the conventional method in which the memory cells slowest at erasing are solely detected, while the memory cells fastest at erasing are not detected, so that the erasing pulse is controlled only by the variations in threshold voltage that are produced in the manufacturing process. Accordingly, by combining information on the leakage current with information on the cells slowest at erasing, the intrinsic erasing characteristic of the memory cells can fully be obtained according to the present invention, thereby easily realizing a reading operation at a low voltage and an improvement in the production yield of devices.

In other words, since it is examined, after the erasing (writing) of the flash memory, whether or not the leakage current exists in memory cells so that the value of the erasing (writing) control pulse is set in the absence of a leakage current, misreading from the memory can be prevented, thereby providing a highly reliable flash memory. The present invention is particularly effective in the case where the power-supply voltage of the flash memory is reduced, for an excessively erased (excessively written) cell is easily generated in this case.

DETAILED DESCRIPTION OF THE PREFERRED EMBODIMENTS

Figure 1:
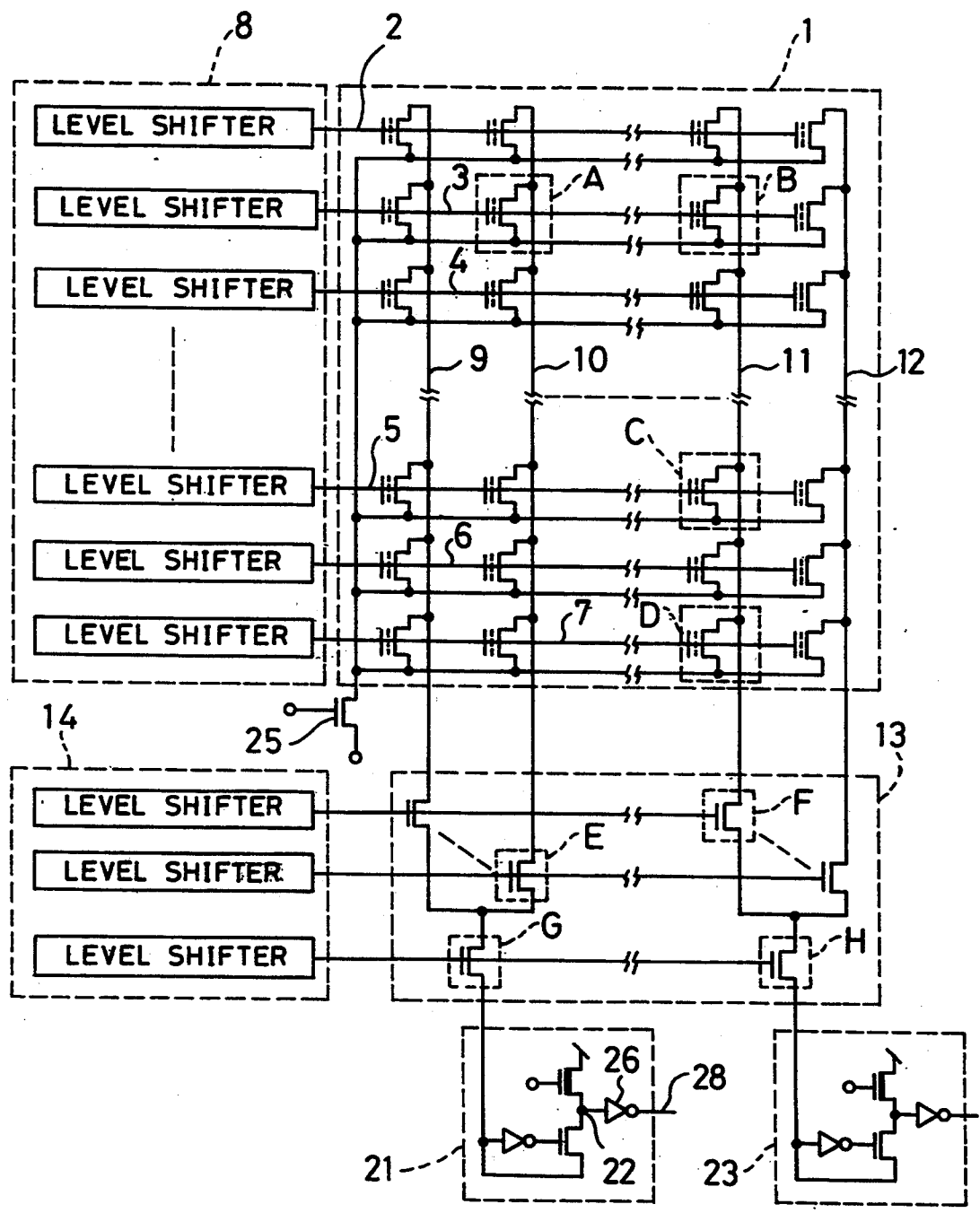
FIG. 1 is a circuit diagram showing the structure of a flash memory according to an embodiment of the present invention.

Below, an embodiment of the present invention will be described with reference to FIGS. 1 and 2. The structure of the circuit shown in FIG. 1 is similar to a conventional circuit structure, and hence is not novel. However, the operation thereof is solely different from that of the conventional circuit.

In FIG. 1, a memory cell array 1 consists of memory cells A, B, C, and D. To the gates of the memory cells A, B, C, and D are connected word lines 2 to 7. The word lines 2 to 7 are individually connected to level shifters 8 for switching the level of the voltage to and from High, Regular, 0 V, and Negative in accordance with the writing, erasing, and reading operations. The sources of the memory cells are connected to a transistor 25. Bit lines 9 to 12 are connected to a Y gate 13 composed of transistors E, F, G, and H for selecting and switching among these bit lines. The gates of the transistors E, F, G, and H constituting the Y gate 13 are individually connected to level shifters 14. Sense amps 21 and 23 for reading information stored in the memory cell array 1 are connected to each of the bit lines via the Y gate 13.

Each of the sense amps 21 and 23 is a single ended one of current detector type, which detects an electric current flowing through the selected memory cell connected to the bit line via the Y gate 13 in the reading of information. FIG. 1 also shows a node 22 connecting a p-channel MOS transistor and an n-channel MOS transistor. An output 28 is obtained by inverting the voltage of the node 22 by the logic NOT operation with the inverter 26. For example, when a memory cell A in FIG. 1 is selected in the reading operation and the power-supply voltage is applied to the gate of the memory cell A, if the memory cell A is in the erasing state at a low threshold voltage, a current is allowed to flow from the sense amp 21 to the memory cell A, thereby lowering the voltage of the node 22, so that the output 28 of the inverter 26 is set to "High". Even when the gate voltage of the memory cell A is increased to the power-supply voltage, because the threshold voltage of the memory cell A is high, a current does not flow through the memory cell A, and the voltage of the node 22 is increased to the power-supply voltage, so that the output 28 of the inverter 26 is set to "Low".

Below, the operation of the above structure in practicing the erase control method according to the present invention will be described with reference to FIGS. 1 and 2.

Figure 2:
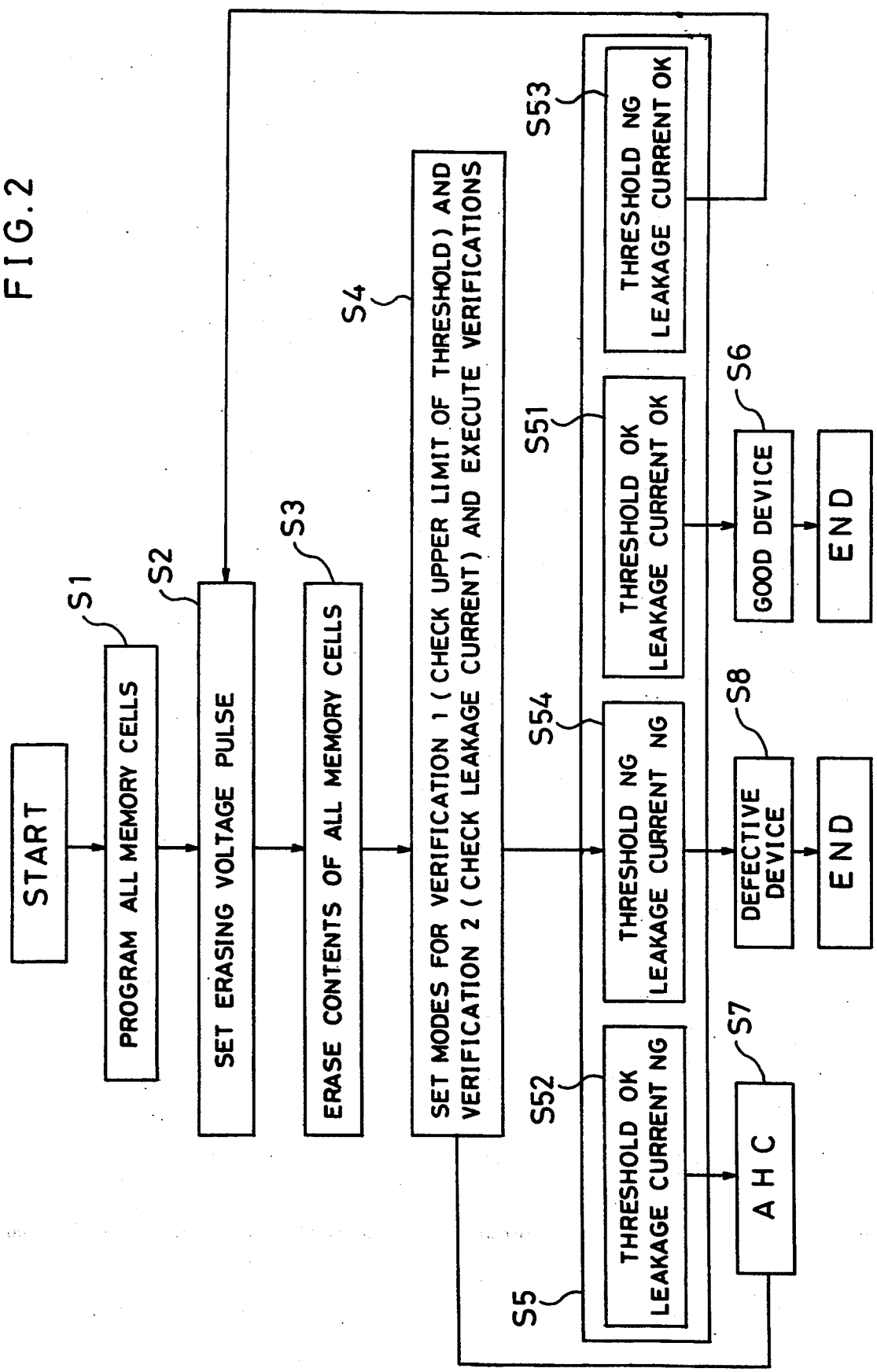
FIG. 2 is a flow chart showing an erase control method according to the embodiment of the present invention.
Figure 3:
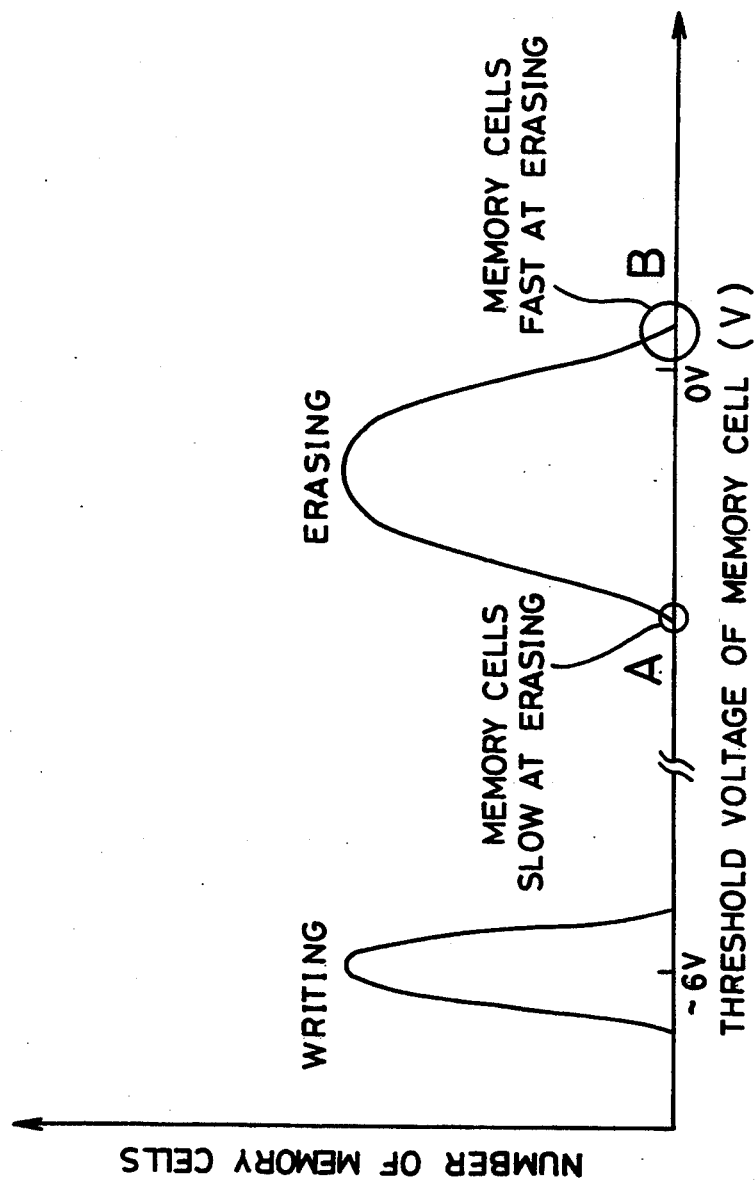
FIG. 3 is a view showing the distribution of the threshold voltages of memory cells.
Figure 4:
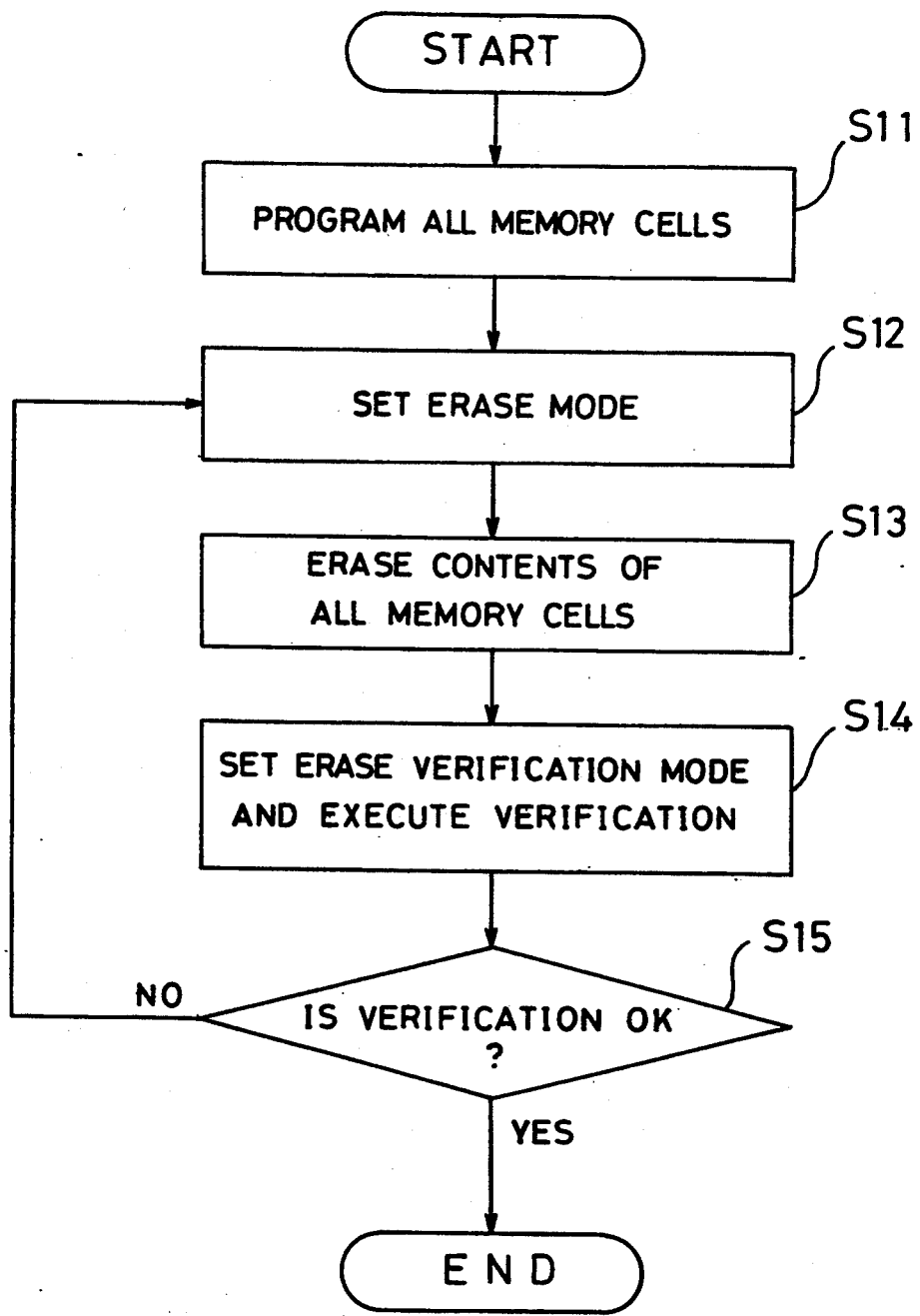
FIG. 4 is a flow chart of a conventional erase control method.

In FIG. 2, prior to erasing, the writing of all the memory cells is first performed in Step S1 for setting the initial states. In other words, all the memory cells are set in the state at a high threshold voltage. By way of specific example, the gate voltage and drain voltage of the memory cell are set at 12 V and 5 V, respectively, by means of a ROM writer or the like, while its source is connected to the ground. By injecting electrons to the floating gate or the like, the threshold voltage can be increased to about 6 V or higher. The writing of all the memory cells is performed because, if the memory cells prior to erasing includes a memory cell in the state at a low threshold voltage, the low threshold voltage of the cell is further lowered by the application of the voltage pulse for simultaneous erasing, so that the difference in threshold voltage between the cell and other cells becomes significantly great. Consequently, it becomes necessary to roughly equalize the states of the memory cells prior to erasing. However, Step S1 is not mandatory, and is not required if the states of all the memory cells are substantially equal.

After the setting of the initial state, the erase control method consisting of Steps S2 to S5 of the present invention is implemented as follows.

Step S2: The voltage pulse to be applied for the purpose of simultaneously erasing the written information is temporarily set. For example, the voltage pulse is set to, e.g., 5 to 6 V, which are equal to the power-supply voltage (about 3 V in the case of low-voltage specification), and the application time is set to $0.1 \times 10^{-3}$ seconds.

Step S3: The voltage pulse set in Step S2 is applied to all the memory cells so as to simultaneously erase the information written therein. In other words, the threshold voltages of the memory cells are lowered. Specifically, for example, the gate voltage of the memory cell is set to 0 V, the drain is opened, and the source voltage is set to 12 V by means of a ROM writer or the like, so that electrons are removed from the floating gate or the like, thereby lowering the threshold voltage to about 1.0 V, which is the initially intended value. With the setting of the voltage, it is possible to lower the threshold voltage to $-4$ to $-5$ V by varying erasing time. It is also possible to set the gate voltage to $-8$ V, to open the drain, and to set the source voltage to 5 V.

Step S4: Verification is carried out with respect to all the memory cells in order to examine whether or not the threshold voltages are sufficiently lowered, or whether or not the erasing operation is performed normally. The present invention performs Verification 1 and Verification 2, which will be described below.

Verification 1; This is the same as the conventional verification, in which it is examined whether or not the threshold voltage of each memory cell has reached a specified value or under, that is, whether or not the erasing operation is completely performed without being suspended. In Verification 1, the setting of the voltage is carried out by means of a constant voltage circuit disposed in the flash memory or by means of an external apparatus for setting and supplying a voltage to the flash memory. The specific value used here is, e.g., about 1.5 V. In Verification 1, if there is at least one memory cell having a high threshold voltage, the procedure returns to Step S2 under a given condition, where the erasing voltage pulse is reset, so as to erase the contents of all the memory cells in Step S3. Then, in Step S4, it is examined again whether or not the threshold voltage has reached the specified value or under, that is, whether or not the erasing operation is completely performed. Thus, in Verification 1, the erasing operation is repeatedly performed till all the memory cells are sufficiently erased.

Verification 2; It is examined whether or not the leakage current in the memory cell has reached a specified limit value or under. This is because any memory cell that is put in the excessively erased state by the erasing operation in Step S3 may cause the misreading of information if a leakage current is generated. The procedure for checking the leakage current is substantially the same as that of the normal reading operation, except that the normal reading operation is executed with all the word lines in a non-selected state. For example, all the level shifters 8 are set in the non-selected state and all the word lines 2 to 7 are set in the non-selected state (the gate voltage of all the memory cells is 0 V), so as to prepare for the reading operation. Next, one bit line is selected by the Y gate 13, so that the leakage current flowing along the selected bit line is detected by means of the sense amps 21 and 23. In this case, since all the word lines 2 to 7 are operated in the non-selected state, no current is expected to flow in principle. However, if an excessively erased memory cell exists on the selected bit line and hence a leakage current is generated, the current is allowed to flow along the bit line, though all the word lines are set in the non-selected state. Consequently, the current is allowed to flow from the sense amp 21, for example, into the excessively erased memory cell, thereby lowering the voltage of the node 22, so that the output 28 of the inverter 26 is set to "High". Conversely, if a leakage current is not generated, the current is not allowed to flow along the bit line, so that it does not flow from the sense amp 21 into the memory cell. Consequently, the voltage of the node 22 is increased, so that the output 28 of the inverter 26 is set to "Low".

In this manner, it is possible to examine the presence or absence of the leakage current generated in the memory cell with the use of the conventional circuit structure for reading information. In addition, the leakage current can be controlled by the structure to a limit value in the range detectable by the sense amp or lower. Consequently, even if the leakage current equal to or lower than the limit value is generated, it is not detected by the sense amp, so that the misreading of information can be prevented.

The present invention has adopted the method in which all the memory cells lying on the same bit line are simultaneously detected for a leakage current, not the method in which each memory cell is detected one after another for a leakage current. The reason for this is that, in the case of reading information out of specified memory cell, not only the specified memory cell but also all the other memory cells lying on the same bit line convey the influence of the leakage current to the sense amps 21 and 23, so that it is more practical to check all the memory cells on the same bit line simultaneously.

If the result of Verification 2 shows no leakage current, there should be no problem. However, if a leakage current is generated, it is required to increase the threshold voltage again, for one of the memory cells must be in the excessively erased state. As the method of increasing the threshold voltage, e.g., a method termed avalanche hot carrier (AHC) injection can be used ("A SELF-CONVERGENCE ERASING SCHEME FOR A SIMPLE STACKED GATE FLASH EEPROM" Seiji YAMADA et al, IEDM Tech. Digest, 1991, p307). Specifically, the method can be practiced, for example, by setting the gate voltage and drain voltage to 0 V and 5 V, respectively, and connecting the source to the ground. In the case of controlling the threshold voltage using the avalanche hot carrier injection, it is also possible to intentionally generate the excessively erased state in Step S3 in advance and then execute the AHC and Verification 1 and Verification 2, thereby controlling the threshold voltage value.

In the foregoing procedure, Verification 1 should not be executed independently from Verification 2 as a completely separate step. It is necessary to execute Verification 2 in parallel with Verification 1. That is, since the threshold voltages of all the memory cells should be sufficiently lowered (Verification 1), though they should not be excessively erased, the erasing voltage pulse must be set so that the requirements of Verification 1 and Verification 2 are satisfied at the same time. No matter how the erasing voltage pulse is set, if the requirements of Verification 1 and Verification 2 are not satisfied at the same time in a certain device, the device is judged a defective product.

Step S5: As described above, the subsequent step is selected from among Steps S51 to S54 in accordance with the result of step S4.

Step S51; If the threshold voltages of all the memory cells are equal to or lower than the specified value and there is no leakage current, the verification is answered with "Yes" (Step S6), thereby completing the flow.

Step S52; Although the threshold voltages of all the memory cells are equal to or lower than the specified value, if a leakage current is generated, the threshold voltages are increased again by the AHC or like method (Step S7), so that the threshold voltages and leakage current are checked again in Step S4.

Step S53; Although a leakage current is not generated, if the threshold voltage of any of the memory cell has not reached the specified value or under, the processes of setting the erasing voltage pulse (Step S2), erasing (Step S3), and verification (Step S4) are repeatedly performed.

Step S54; If the requirements that the threshold voltages of all the memory cells are equal to or lower than the specified value and that there exists no leakage current are not satisfied no matter how the erasing voltage pulse is set, it is judged that the device in question is a defective product (Step S8), thereby completing the flow.

Thus, by repeatedly performing a sequence of steps of the present invention, the erasing voltage pulse can be kept in a specified range, so that the memory can surely be erased or read without being excessively erased even when the power-supply voltage is low.

Although the present embodiment has described the controlling of the erasing voltage pulse, there are some devices in which the relationship between the erasing threshold voltage and the writing threshold voltage is reversed. In these devices, the state at a high threshold voltage is used as the erasing state, while the state at a low threshold voltage is used as the writing state. The present invention is also applicable to these devices. In this case, however, the writing voltage pulse is controlled instead. Since the threshold voltages are lowered by the writing operation, it is necessary to be alert to the generation of the leakage current due to excessive writing. Moreover, since the writing operation is not performed with respect to all the memory cells, it is not necessary to check each memory cell or each bit line in the verification. It is sufficient to execute Verification 1 only with respect to a specific memory cell in which information is written and check the presence or absence of a leakage current flowing along the bit line on which the specific memory cell exists. As for other features, they are the same as those of the above-mentioned case for erasing, so that the write control can be performed with the same flow as the foregoing flow.

To practice the methods of controlling the erasing and writing of information, it is also possible to program the individual steps of the above flow in a ROM writer or the like and implement the present invention using the ROM writer in the erasing or writing operation.

I claim:
1. A method of controlling the erasing of information in a flash memory, comprising the steps of:
   setting the value of a control voltage pulse for reducing the threshold voltages of memory cells constituting the flash memory;
   reducing the threshold voltages of all the memory cells with the application of said control voltage pulse;
   checking an upper limit of all the reduced threshold voltages of said memory cells;
   checking a leakage current generated in said memory cells on a same bit line; and
   resetting the value of said control voltage pulse so that the highest threshold voltage of all the reduced threshold voltages of said memory cells is sufficiently lowered and that said leakage current generated in the memory cells on the same bit line reaches a specified limit value or under,
   wherein the erasing of information in said flash memory is accomplished by applying said reset control voltage pulse to all said memory cells.

2. A method of controlling the erasing of information in a flash memory according to claim 1, wherein the leakage current is detected by means of a single ended sense amplifier of current detector type which is used for reading the information stored in the flash memory.

3. A method of controlling the writing of information in a flash memory, comprising the steps of:
   setting the value of a control voltage pulse for reducing the threshold voltages of memory cells constituting the flash memory;
   reducing the threshold voltage of a specific memory cell with the application of said control voltage pulse;
   checking a magnitude of the reduced threshold voltage of said specific memory cell;
   checking a leakage current generated in said specific memory cell; and
   resetting the value of said control voltage pulse so that the reduced threshold voltage of said specific memory cell is sufficiently lowered and that said leakage current generated in said specific memory cell reaches a specified limit value or lower,
   wherein the writing of information in said flash memory is accomplished by applying said reset control voltage pulse to said specific memory cell.

4. A method of controlling the writing of information in a flash memory according to claim 3, wherein the leakage current is detected by means of a single ended sense amplifier of current detector type which is used for reading the information stored in the flash memory.

* * * * *